US006275721B1

(12) United States Patent
Darrow et al.

(10) Patent No.: US 6,275,721 B1
(45) Date of Patent: Aug. 14, 2001

(54) INTERACTIVE MRI SCAN CONTROL USING AN IN-BORE SCAN CONTROL DEVICE

(75) Inventors: Robert David Darrow, Scotia, NY (US); Charles Lucian Dumoulin, London (GB); Christopher Judson Hardy, Schenectady, NY (US)

(73) Assignee: General ElectricCompany, Schenectady, NY (US)

( * ) Notice: Subject to any disclaimer, the term of this patent is extended or adjusted under 35 U.S.C. 154(b) by 0 days.

(21) Appl. No.: 09/332,087

(22) Filed: Jun. 10, 1999

(51) Int. Cl.[7] .................................................. A61B 5/055
(52) U.S. Cl. ........................... 600/410; 600/411; 324/318
(58) Field of Search .................................... 600/410, 411, 600/427, 429, 414, 417, 426; 324/307, 309, 318

(56) References Cited

U.S. PATENT DOCUMENTS

| 5,365,927 | * | 11/1994 | Roemer et al. | 600/410 |
|---|---|---|---|---|
| 5,512,826 | * | 4/1996 | Hardy et al. | 624/309 |
| 5,512,827 | * | 4/1996 | Hardy et al. | 324/309 |
| 5,590,655 | * | 1/1997 | Hussman | 600/429 |
| 5,947,900 | * | 9/1999 | Derbyshire et al. | 600/410 |
| 6,021,342 | * | 2/2000 | Brabrand | 600/427 |
| 6,023,636 | * | 2/2000 | Wendt et al. | 600/410 |

* cited by examiner

Primary Examiner—Ruth S. Smith
(74) Attorney, Agent, or Firm—Jean K. Testa; Donald S. Ingraham

(57) ABSTRACT

A scan control device located in the bore of an MRI system magnet includes tracking coils and a display. Location and alignment of the scan control device is tracked by the MRI system using signals acquired from the tracking coils. These signals are also used to update the scan parameters such that the scan plane of the image acquired by the MRI system is controlled by the scan control device location and orientation. The image is produced on the display to provide an attending physician with interactive control of the image from the magnet bore.

21 Claims, 4 Drawing Sheets

INTERACTIVE MRI SCAN CONTROL USING AN IN-BORE SCAN CONTROL DEVICE

BACKGROUND OF THE INVENTION

The field of this invention is magnetic resonance imaging (MRI) methods and systems. More particularly, the invention relates to interactive control of the scan plane prescription during an MRI guided procedure.

When a substance such as human tissue is subjected to a uniform magnetic field (polarizing field $B_0$) in the z direction of a Cartesian coordinate system, the individual magnetic moments of the nuclear spins in the tissue attempt to align with this polarizing field, but precess about the field in random order at their characteristic Larmor frequency. If the substance, or tissue, is also subjected to a magnetic field (excitation field $B_1$) which is in the x-y plane and which is near the Larmor frequency, the net aligned moment $M_z$ may be rotated, or "tipped", into the x-y plane to produce a net transverse magnetic moment $M_t$. A signal is emitted by the excited spins after the excitation signal $B_1$ is terminated, and this signal may be received and processed to form an image.

When utilizing these signals to produce images, magnetic field gradients ($G_x$, $G_y$ and $G_z$) are employed. Typically, the region to be imaged is scanned by a sequence of measurement cycles, or "views", in which these gradients vary according to the particular localization method being used. The resulting set of received nuclear magnetic resonance (NMR) signals are digitized and processed to reconstruct the image using one of many well known reconstruction techniques.

Intra-operative MR imaging is employed during a medical procedure to assist the physician in guiding an instrument. For example, during a needle biopsy the MRI system is operated in a real-time mode in which image frames are produced at a high rate so that the physician can monitor the location of the needle as it is inserted. A locator device such as that described in Dumoulin et al. U.S. Pat. No. 5,271,400 issued Dec. 21, 1993 and U.S. Pat. No. 5,307,808, issued May 3, 1994, both of which are assigned to the instant assignee, may be used to track the location of the instrument and provide coordinate values to the MRI system which enable it to mark the location of the instrument in each reconstructed image. The medical instrument is attached to a handpiece that is manipulated by the physician and whose position is detected by surrounding sensors. For example, the handpiece may emit light from two or more light emitting diodes which is sensed by three stationary cameras.

Tracking devices which employ the MRI system to locate markers in the medical device have also been developed. As described in Dumoulin et al. U.S. Pat. Nos. 5,271,400, 5,307,808 and 5,318,025, Souza et al. U.S. Pat. No. 5,353,795 and Watkins et al. U.S. Pat. No. 5,715,822, each of which is assigned to the instant assignee, such tracking systems employ a small coil attached to a catheter or other medical device to be tracked. A NMR pulse sequence is performed to establish desired magnetic field gradients to produce transverse magnetization at the location of the tracking coil carried by the tracked device. The location of the tracking coil is determined and is superimposed at the corresponding location in a medical image acquired with the same MRI system.

During an interactive MRI diagnostic procedure or interventional procedure, it is common for the operator to frequently change the scan plane coordinates and orientation. It may also be desirable for the operator to modify the imaging pulse sequence parameters or exercise other control over the MR scanner in a rapid fashion, especially for interactive control of real-time imaging sequences. Additionally, it may be desirable for the operator to view in-bore the results of image formation on a screen built into the controlling device. There is currently no method that permits an operator working in-bore to perform such operations.

SUMMARY OF THE INVENTION

A scan control device for use in the bore of an MRI system to interactively control the scan plane prescription includes a housing that encloses a plurality of tracking RF coils and a corresponding plurality of MR signal sources. The MRI system periodically performs tracking coil NMR pulse sequences during the MRI interactive procedure that acquire tracking coil data from which the position and orientation of the scan control device are determined and then used to update the scan plane prescription of the NMR imaging pulse sequence being performed. During the MRI interactive procedure, the operator manipulates the scan control device to point at particular anatomy of interest and indicate the desired viewing orientation. The tracking coil NMR pulse sequences are interleaved with the imaging NMR pulse sequences, and the acquired tracking coil data are used to calculate scan plane parameters for updating the NMR pulse sequence parameters.

Another aspect of the invention is the provision of visual feedback to the operator during the MRI interactive procedure. The scan control device may also house a display which produces the image reconstructed from data acquired with the NMR imaging pulse sequences. As the scan control device is manipulated about the patient, the NMR imaging pulse sequence is continuously updated and the reconstructed image on the display is updated to promptly indicate to the operator the imaged anatomy.

Yet another aspect of the invention provides the operator with the ability to alter the scan prescription during the MRI interactive procedure. The scan control device may include manually operable data input devices that can be used by the operator to alter the NMR imaging pulse sequence prescription. For example, parameters such as transmit-receive (TR) period, excitation pulse flip-angle or field of view may be adjusted by the operator while in the bore of the MRI system magnet.

DESCRIPTION OF THE PREFERRED EMBODIMENTS

Figure 1:
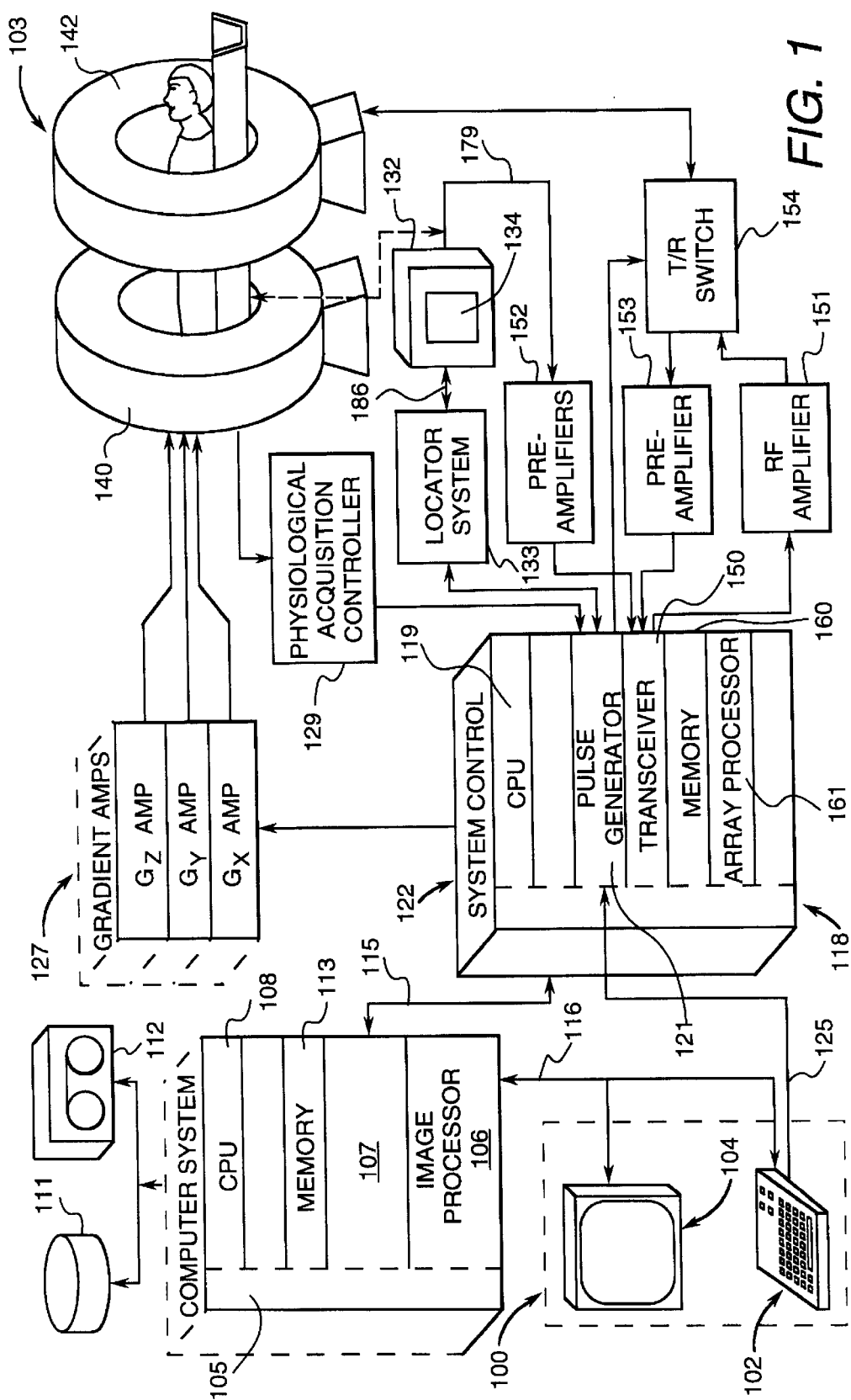
FIG. 1 is a block diagram of an MRI system employing the invention.

FIG. 1 illustrates the major components of an MRI system which incorporates the invention. A magnet system 103 produces a polarizing magnetic field in a region commonly referred to as the magnet "bore". Operation of the system is controlled from an operator console 100 which includes a keyboard and control panel 102 and a display 104. Console 100 communicates through a link 116 with a separate computer system 107 that enables an operator to control the production and display of images on the screen of display 104. Computer system 107 includes a number of modules which communicate with each other through a backplane 105. These include an image processor module 106, a CPU (central processing unit) module 108, and a memory module 113 known in the art as a frame buffer for storing image data arrays. Computer system 107 is linked to a disk storage 111 and a tape drive 112 for storage of image data and programs, and communicates with a separate system control 122 through a high speed parallel link 115.

System control 122 includes a set of modules connected together by a backplane 118 These include a CPU module 119 and a pulse generator module 121 which is coupled to operator console 100 through a serial link 125. System control 122 receives commands from the system operator through link 125 which indicate the scan sequence to be performed. Pulse generator module 121 operates the system components in accordance with a set of scan parameters to carry out the desired scan sequence, producing data that indicate the timing, strength and shape of the RF (radio frequency) pulses to be produced, and the timing and length of the data acquisition window. Pulse generator module 121 is coupled to a set of gradient amplifiers 127 to control the timing and shape of the gradient pulses to be produced during the scan. Pulse generator module 121 also receives patient data from a physiological acquisition controller 129 that receives signals from a number of different sensors attached to the patient, such as ECG (electrocardiogram) signals from electrodes or respiratory signals from a bellows. Pulse generator module 121 is also coupled to a locator system 133 that interfaces with a scan control device 132. As described in more detail below, locator system 133 performs a number of functions including: monitoring location and orientation of scan control device 132; calculating updated scan parameters for pulse generator 121; and supplying image data to a display 134 on scan control device 132.

The gradient waveforms produced by pulse generator module 121 are applied to a gradient amplifier system 127 comprised of $G_x$, $G_y$ and $G_z$ amplifiers. Each gradient amplifier excites a corresponding gradient coil in magnet system 103 to produce the magnetic field gradients used for position encoding acquired signals. A transceiver module 150 in system control 122 produces pulses which are amplified by an RF amplifier 151 and supplied to an RF coil magnet system 103 by a transmit/receive switch 154. The resulting signals radiated by the excited nuclei in the patient may be sensed by the same RF coil and supplied through transmit/receive switch 154 to a preamplifier 153. The amplified NMR signals are demodulated, filtered, and digitized in the receiver section (not shown) of transceiver 150. Transmit/receive switch 154 is controlled by a signal from pulse generator module 121 to electrically connect RF amplifier 151 to the RF coil during the transmit mode and to connect the RF coil to preamplifier 153 during the receive mode. Scan control device 132 includes three RF tracking coils which acquire NMR signals that indicate the location and orientation of the scan control device. These NMR signals are provided to a set of three pre-amplifiers 152 which apply the amplified signals to transceiver module 150.

The NMR signals picked up by an RF coil in magnet assembly 103 are digitized by transceiver module 150 and transferred to a memory module 160 in system control 122. When an array of k-space data (i.e., spatial frequency space data) has been acquired in memory module 160, an array processor 161 operates to Fourier transform the k-space data into an array of image data which is presented to the attending physician on a display 134 that forms part of scan control device 132. This image data may also be conveyed through parallel link 115 to computer system 107 where it is stored in disk memory 111. In response to commands received from operator console 100, the image data may be archived on tape drive 112, or may be further processed by image processor 106 and conveyed to operator console 100 and presented on display 104.

Data acquired from the tracking RF coils in scan control device 132 are reconstructed into profiles for use by locator system 133 to determine location of the desired scan plane. Locator system 133 employs this information to alter the scan parameters used by pulse generator module 121 to acquire subsequent image data.

While a conventional MRI system may be used to implement the invention, in the preferred embodiment an MRI system which is designed to allow access by a physician is employed. When an intra-operative MR imaging procedure is conducted, a patient is placed in the bore of magnet system 103 and a region of interest in the patient is aligned near the system isocenter located between two, spaced magnet rings 140 and 142. A physician standing between magnet rings 140 and 142 has unrestricted access to the region of interest in the patient, and scan control device 132 may be moved around within the magnet bore to point at specific anatomy.

The images to be produced by the MRI system are prescribed by selecting an appropriate NMR imaging pulse sequence to be executed by pulse generator 121. Location and orientation of the slices or 3D region to be imaged are also prescribed and are determined by the particular patient anatomy that the physician wants to see during the procedure being performed. This image is produced on display 134 which is a part of scan control device 132 that is in the bore of magnet system 103 with the patient and physician. Scan control device 132 may be manipulated by the physician to "point" at specific patient anatomy and this "pointing" is sensed by the tracking coils and used to update the scan parameters. As a result, an updated image is acquired, reconstructed and produced on display 134 which depicts the anatomy of interest to the physician. The physician can thus move scan control device 132 over and around the patient and the MRI system continuously updates the image on display 134 to depict the anatomy of interest.

Figure 3:
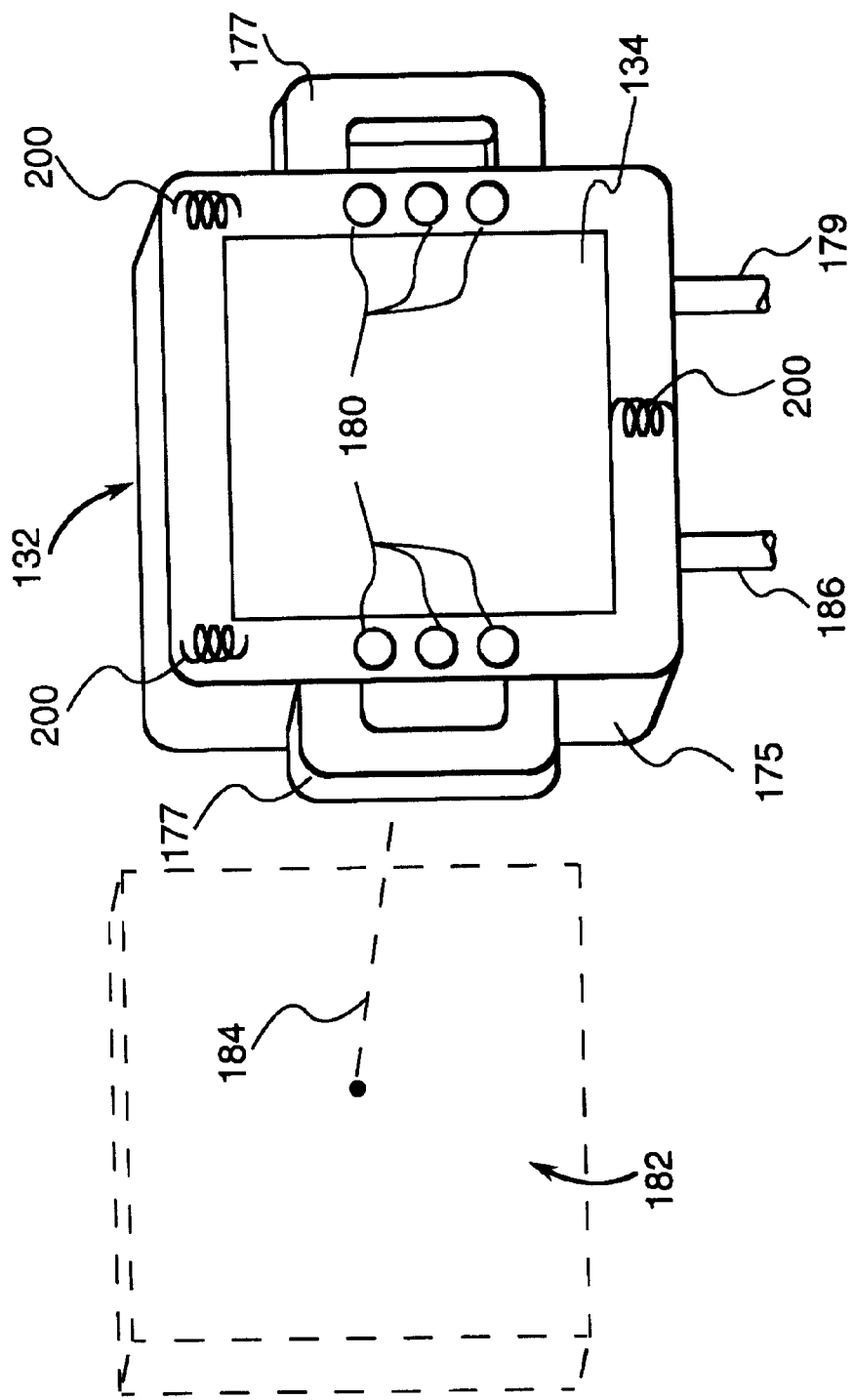
FIGS. 3 is a pictorial view of a scan control device which employs three of the tracking coils shown in FIG. 2.

The preferred embodiment of scan control device 132, as shown in FIG. 3, includes a 6×6 inch liquid crystal display 134 enclosed in a housing 175.

Housing 175 is substantially rectangular in shape and includes a pair of handles 177 mounted on each of its sides. The attending physician may hold scan control device 132 by handles 177 and "aim" it at the patient. Three tracking coils 200 are mounted within housing 175 and connected through cable 179 to pre-amplifiers 152 (FIG. 1). Tracking coils 200 define a plane, and an imaginary line between the top two tracking coils 200 defines an orientation in that plane.

Scan control device 132 includes a set of thumb switches 180 mounted inboard of each handle 177. The thumb switches can be toggled by the physician to increase or decrease the value of a scan parameter to enable the image produced on display 134 to be changed during the procedure. The particular scan parameters that may be adjusted by thumb switches 180 is configurable by the operator; however, a predetermined one of the thumb switches is always configured to adjust the distance of an image plane 182 from the plane of scan control device 132 along a sighting axis 184. The sighting axis extends from the center of the display, perpendicular to the plane defined by the three tracking coils 200. Image plane 182 is centered on axis 184 at a distance that is manually adjustable with thumb switch 180. The physician can thus aim scan control device 132 at the patient from any desired angle and orientation and adjust the predetermined one of thumb switches 180 to move scan plane 182 to the proper depth.

A second one of thumb switches 180 may be set in one position to continuously update the location and orientation of scan plane 182 as scan control device 132 is moved around within the bore of the magnet. When the desired image is obtained, this second one of the thumb switches may be toggled to a second position which locks scan plane 182 in a fixed orientation and position. The physician may then operate the other configured thumb switches 180 to adjust such scan parameters as field of view, TR and flip-angle until the best image is obtained for the particular medical procedure being performed. Other parameters, such as window width and level used during image display may also be adjusted.

Scan control device 132 is connected to locator system 133 (FIG. 1) by a cable 186 which conveys video data to display 134 and conveys signals from thumb switches 180 back to locator system 133. Scan control device 132 is constructed of materials compatible with the environment in the bore of an MRI system, and suitable filtering and shielding of electrical signals is performed, as is known in the art.

Figure 2:
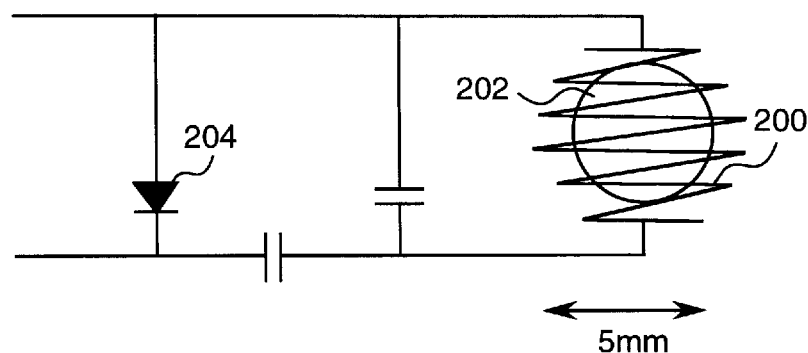
FIG. 2 is a schematic diagram of a tracking coil and associated MR signal source used to practice the invention.

FIG. 2 shows one of the three small RF tracking coils 200 that are enclosed in scan control device 132 (FIG. 3). Each of these RF tracking coils contains as a sample 202 a spherical glass container (with a 5 millimeter internal diameter) of water doped with $CuSO_4$ to provide a "spin—spin" or transverse relaxation time $T_2$ of approximately 10 milliseconds. Each sample 202 is enclosed in a tightly fitting spherically wound RF coil 200 tuned to 63.9 MHz (for 1.5 Tesla $^1H$ NMR). RF coils 200 are receive coils and include a switchable PIN diode 204 for decoupling during RF transmission by the MRI system RF body coil.

Figure 4:
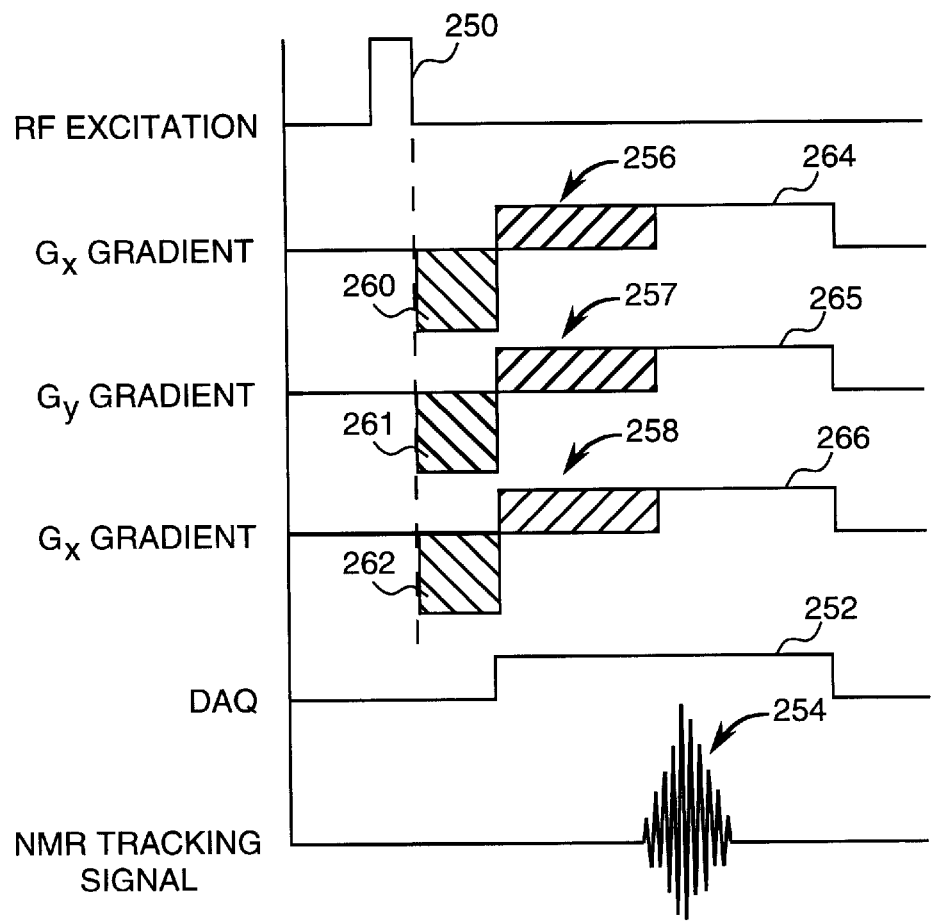
FIG. 4 is a graphic representation of an NMR pulse sequence used by the MRI system of FIG. 1 to measure the position of the tracking coil of FIG. 2.

The position of a tracking coil 200 relative to the gradient isocenter is measured using the position measurement NMR pulse sequence shown in FIG. 4. This gradient recalled echo pulse sequence yields a signal that is essentially a Fourier transform of a projection of the coil location along the readout gradient direction. Assuming that tracking coil 200 is small, its position $S_1$ is modeled by:

$$S_1 = \frac{\Delta \omega}{\gamma G_1} \quad (1)$$

where $\omega$ is the measurement angular frequency of the gradient echo signal relative to $\omega_0$, the Larmor frequency, and $G_1$ is the applied readout gradient. The three-dimensional position of each tracking coil 200 can be identified from three linearly independent gradient echoes.

As described in the above cited Souza et al. U.S. Pat. No. 5,353,795, issued Oct. 11, 1994 and entitled "Tracking System To Monitor The Position Of A Device Using Multiplexed Magnetic Resonance Detection", which is incorporated herein by reference, errors arising from resonance offset conditions make it necessary to acquire more than three tracking coil measurements. While it is possible to acquire two measurements along each gradient axis to obtain the necessary error free tracking NMR data, such an approach requires six separate measurements. In a preferred embodiment, a Hadamard MR tracking sequence is performed using the measurement pulse sequence of FIG. 4. This tracking sequence requires only four separate measurements to acquire a complete NMR tracking coil data set.

As shown in FIG. 4, the tracking coil measurement pulse sequence includes a non-selective RF excitation pulse 250 which is applied to the MRI system whole body RF coil in magnet system 103 (FIG. 1). Pulse 250 has a flip angle of from 10 to 60 degrees and produces transverse magnetization in spins located throughout the magnet bore. Three gradient waveforms 256, 257 and 258 are then applied to respective gradient coils in magnet system 103 (FIG. 1) to produce a gradient recalled NMR echo signal. The NMR signals acquired by each RF tracking coil are provided separately to transceiver module 150 (FIG. 1). The three gradient waveforms 256, 257 and 258 are applied along the respective $G_x$, $G_y$ and $G_z$ gradient axes in the magnet system and each of the waveforms includes a respective dephase lobe 260, 261 and 262 and a respective readout lobe 264, 265 and 266. The area of each dephasing lobe 260–262 is equal to one-half the area of respective readout lobes 264–266.

In the measurement pulse sequence of FIG. 4, all of the gradients 256–258 have the same polarity, herein designated "−". This data acquisition pulse sequence is performed a total of four times with the polarity of the $G_x$, $G_y$ and $G_z$ gradient pulses selectively reversed as set forth in Table 1.

TABLE 1

|  | $G_x$ | $G_y$ | $G_z$ |
|---|---|---|---|
| acquisition 1 | − | − | − |
| acquisition 2 | + | + | − |
| acquisition 3 | + | − | + |
| acquisition 4 | − | + | + |

As indicated above, four NMR tracking signals 254 from each tracking coil 200 (FIG. 3) are Fourier transformed to produce four corresponding projections $P_1$, $P_2$, $P_3$ and $P_4$. Together, these four projections form an NMR tracking data set from which the x, y and z coordinates of the tracking coil position can be calculated.

Figure 5:
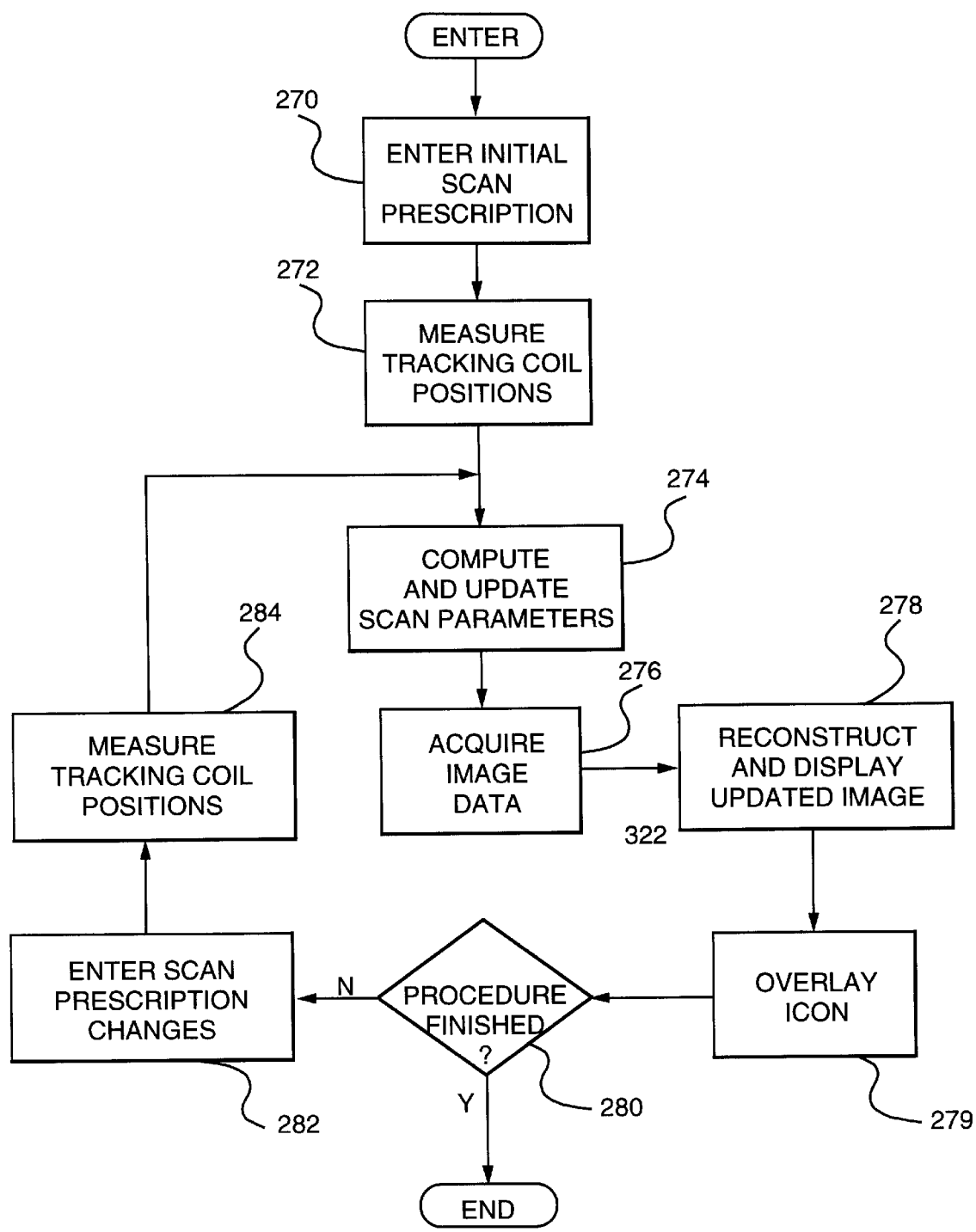
FIG. 5 is a flow chart of the method used to practice the invention.

The scan is carried out by a series of steps depicted in FIG. 5. When the procedure is started, the operator enters the initial scan prescription as indicated at step 270. This step includes the selection of an appropriate NMR imaging pulse sequence and the particular scan parameters that locate and orient the slice plane or 3D volume which is to be imaged.

At the next step 272, the present positions of tracking coils 200 are measured. This is done by acquiring the four projections $P_1$–$P_4$ as described above with the Hadamard encoding indicated in Table 1. The locations of the signal peaks are then combined as follows:

$$S_x = -P_1 + P_2 + P_3 - P_4 \quad (1)$$

$$S_y = -P_1 + P_2 - P_3 + P_4 \quad (2)$$

$$S_z = -P_1 - P_2 + P_3 - P_4 \quad (3)$$

to provide the coordinates $S_x$, $S_y$ and $S_z$ of tracking coil 200.

A loop is next entered in which image data and tracking coil data are acquired in an interleaved manner and the displayed image is updated on a real-time basis. As indicated at step 274, scan parameters for pulse generator 121 (FIG. 1) are updated using the tracking coil position data as well as any changes in the scanning parameters suplied by the operator from thumb switches 180 (FIG. 3).

As indicated above with reference to FIG. 3, the positions of the three tracking coils 200 define the location and orientation of the plane of display 134. The desired imaging plane 182 is offset from this display plane along sighting axis 184 by an amount determined by operation of a thumb switch 180. This updated information is used to calculate the appropriate rotation matrices required to produce oblique MR images. This updated information is also used to produce the appropriate frequency and phase offsets required to position imaging plane 182 with respect to the MRI system isocenter. Any other changes in scan parameters supplied from thumb switches 180 are also updated and applied to pulse generator 121 (FIG. 1).

After the scan parameters are updated, image data are acquired at step 276, using the updated scan parameters. Depending on the particular image pulse sequence being used, data for an entire image reconstruction may be acquired, or data for only part of the k-space image data may be acquired. In either instance, the acquired image data are used to reconstruct an updated image, as indicated at step 278, and this updated image is supplied to display 134 on scan control device 132 (FIG. 1).

In a preferred embodiment, an icon representing scan control device 132 may be overlaid on the displayed image, as indicated at step 279. Usually, scan control device 132 is not in the image and, instead, a cursor is displayed at the location intersected by sighting axis 184 (FIG. 3).

If the interactive procedure has finished, as determined at step 280, the process ends. Otherwise, the process loops back to enter scan prescription changes at step 282 and to measure the tracking coil position at step 284. The scan prescription changes are entered from scan control device 132 and the tracking coil positions are updated by performing the position measurement NMR pulse sequence of FIG. 4. Four measurement pulse sequences may be performed as described above to provide four updated projections $P_1$–$P_4$ for each of the three tracking coils 200. In the alternative, only one projection may be updated as described in co-pending Dumoulin et al. U.S. patent application Ser. No. 09/199,405, filed Nov. 25, 1998, assigned to the instant assignee, and entitled "High Speed Tracking of Interventional Devices Using an MRI System", which is incorporated herein by reference. The process then returns to steps 274–279 to update the scan parameters and acquire an updated image as described above.

It should be apparent that many variations are possible from the preferred embodiment described above. For example, rather than continuously updating image on display 134 as scan control device 132 is moved about the patient, a trigger may be provided which must be operated by the physician before an updated image is acquired. This will enable scan control device 132 to be moved without changing the displayed image. When scan control device 132 is properly aligned, the physician may then operate the trigger and acquire an updated image which is reconstructed and displayed. It is also possible to use two different imaging pulse sequences during the procedure. A first pulse sequence may be used during normal interactive display of images as scan control device 132 is moved. Such pulse sequences may provide very fast acquisition, but not produce optimal diagnostic images. When device 132 is in position, however, the physician can operate the trigger and acquire a high resolution image using a different pulse sequence. The physician can thus manipulate scan control device 132 into the desired orientation using the real-time images produced on display 134 for guidance, and then produce a high resolution, clinical image on display 134.

It is also possible to locate the position and orientation of scan control device 132 using other methods. For example, three light sources can be mounted on housing 175 (FIG. 3) and their positions within the bore of the MRI system monitored by cameras.

As another variation, a marker in the form of an MR active substance may be imbedded in scan control device 132. The marker has a unique shape which can be easily identified when scan control device 132 is in the field of view of the acquired image. For example, three of spherical glass samples 202, described above in conjunction with FIG. 3, may be positioned close together in the reconstructed image.

Scan control device 132 may also be used to guide the medical procedure. In one embodiment, for example, a laser diode is mounted on the back of housing 175 (FIG. 3) and directs a visible laser beam along sighting axis 184. A visible spot is produced on the patient where sighting axis 184 impinges, and this spot can serve as a locating guide for a biopsy needle or the like. Scan control device 132 can also serve to orient the medical device. In this instance, a mechanical guide (not shown) is mounted to the back of housing 175 for holding the medical instrument (e.g. biopsy needle) along sighting axis 184. The medical instrument may thus be positioned and oriented at an angle that will operate on the particular anatomy indicated by a marker in the reconstructed image on display 134. This provides real-time feedback to the physician to monitor and adjust patient therapy. If the resulting system is awkward to manually position with accuracy, it is also possible to mount control device 132 on an articulated arm (not shown). A joystick is used to operate the articulated arm to move scan control device 132 into proper position and orientation as determined by the real-time images produced on display 134.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. An MRI system comprising:

a magnet system for producing a polarizing magnetic field in a magnet bore;

a scan control device including a display mounted therein, the scan control device being moveable within the magnet bore and being manipulatable to aim at a subject when said subject is located in the magnet bore;

a set of tracking coils mounted to the scan control device;

a pulse generator for controlling operation of the MRI system to perform an imaging pulse sequence in accordance with a set of scan parameters and for controlling operation of the MRI system to acquire NMR tracking signals from the set of tracking coils;

a locator system for calculating location and orientation of the scan control device from the acquired NMR tracking signals and producing updated scan parameters for the pulse generator; and image reconstruction means for receiving NMR imaging signals produced by the imaging pulse sequence and reconstructing an image of the subject;

wherein the location of the image is determined by the updated scan parameters produced by the locator system.

2. The MRI system as recited in claim 1 in which the display produces the image thereon.

3. The MRI system as recited in claim 1 wherein the set of tracking coils comprises three tracking coils.

4. The MRI system as recited in claim 1 in which the scan control device includes a manually operable input device for changing a selected one of the scan parameters.

5. The MRI system as recited in claim 1 in which the scan control device includes a housing which can be hand-held and hand-aimed.

6. The MRI system as recited in claim 5 in which a pair of handles are mounted to opposite sides of the housing and the display is mounted between the handles.

7. The MRI system as recited in claim 5 in which a manually operable input device is mounted to the housing and is manually operable to change a selected one of the scan parameters.

8. The MRI system as recited in claim 1 wherein the image reconstruction means comprises a transceiver, a memory module coupled to said transceiver, and an array processor responsive to said memory module for providing data for reconstructing said image of the subject.

9. A method for performing an MRI scan with an MRI system having a magnet system for producing a polarizing magnetic field in a magnet bore, comprising the steps of:
   a) performing an imaging pulse sequence in accordance with a set of scan parameters to acquire NMR imaging data;
   b) reconstructing an image using the acquired imaging data;
   c) displaying the image on a display mounted on a scan control device;
   d) changing a selected scan parameter using the scan control device;
   e) updating the imaging pulse sequence; and,
   f) repeating steps a), b), c) and d).

10. The method as recited in claim 9 in which the changed scan parameter is image location.

11. The method as recited in claim 10 in which image location is changed by changing the scan control device location within the magnet bore.

12. The method as recited in claim 11 including the additional step of determining the scan control device location by acquiring NMR data with the MRI system from tracking coils mounted to the scan control device.

13. The method as recited in claim 12 including the step of interleaving the acquired tracking coil NMR data with the acquired NMR imaging data.

14. The method as recited in claim 11 including the step of offsetting the image location at a predetermined distance from the scan control device location.

15. The method as recited in claim 14 in which the step of offsetting comprises directing the offset along a sighting axis.

16. The method as recited in claim 15 including the additional step of guiding a medical instrument along the sighting axis.

17. The method as recited in claim 16 in which the step of guiding a medical instrument along the sighting axis comprises guiding said instrument by a light beam.

18. The method as recited in claim 16 in which the step of guiding a medical instrument comprises guiding said instrument by apparatus attached to the scan control device.

19. The method as recited in claim 11 in which the scan control device is mounted on an articulated arm, said method including the step of changing the location of the scan control device by operating the articulated arm.

20. A method for performing an MRI scan of a subject with an MRI system having a magnet system for producing a polarizing magnetic field in a magnet bore, comprising the steps of:
   a) performing an imaging pulse sequence in accordance with a set of scan parameters to acquire NMR imaging data;
   b) reconstructing an image using the acquired imaging data;
   c) displaying the image on a display mounted on a moveable hand-held scan control device;
   d) moving the scan control device relative to the subject and within the magnet bore; and,
   e) updating the image on the display responsive to the moving step.

21. The method of claim 20 comprising an additional step of guiding a medical instrument responsive to the image on the display.

* * * * *

UNITED STATES PATENT AND TRADEMARK OFFICE
CERTIFICATE OF CORRECTION

PATENT NO. : 6,275,721 B1  
DATED : August 14, 2001  
INVENTOR(S) : Robert David Darrow et al.

It is certified that error appears in the above-identified patent and that said Letters Patent is hereby corrected as shown below:

<u>Claim 9,</u>
A method for performing an MRI scan with an MRI system having a magnet system for producing a polarizing magnetic field in a magnet bore, comprising the steps of:

a) performing an imaging pulse sequence in accordance with a set of scan parameters to acquire NMR imaging data;
   b) reconstructing an image using the acquired imaging data;
   c) displaying the image on a display mounted on a scan control device, the scan control device being moveable within the magnet bore;
   d) changing a selected scan parameter using the scan control device;
   e) updating the imaging pulse sequence; and
   f) repeating steps a), b), c) and d).

Signed and Sealed this

Ninth Day of April, 2002

*Attest:*

JAMES E. ROGAN  
*Director of the United States Patent and Trademark Office*

*Attesting Officer*